(12) United States Patent
Lehner et al.

(10) Patent No.: US 7,455,472 B2
(45) Date of Patent: Nov. 25, 2008

(54) DEVICE FOR PLANE-PARALLEL ATTACHMENT OF TWO MODULES

(75) Inventors: Manfred Lehner, Baiersdorf (DE); Joachim Masatz, Höchstadt (DE); Jürgen Wagner, Stein (DE)

(73) Assignee: Siemens Aktiengesellschaft, München (DE)

( * ) Notice: Subject to any disclaimer, the term of this patent is extended or adjusted under 35 U.S.C. 154(b) by 155 days.

(21) Appl. No.: 11/042,835

(22) Filed: Jan. 24, 2005

(65) Prior Publication Data

US 2005/0180814 A1    Aug. 18, 2005

Related U.S. Application Data

(63) Continuation of application No. PCT/DE2003/002428, filed on Jul. 18, 2003.

(30) Foreign Application Priority Data

Jul. 30, 2002    (DE)    ................... 102 34 788

(51) Int. Cl.
*F16B 3/00*    (2006.01)
*F16B 5/06*    (2006.01)

(52) U.S. Cl. ............... 403/388; 403/286; 403/292; 403/294; 403/381; 403/408.1; 24/458; 24/581.1; 312/111; 312/140

(58) Field of Classification Search ........... 403/24, 403/286, 292, 294, 353, 381, 388, 389, 409.1; 439/928; 312/11, 140; 24/297, 458, 572.1, 24/573.09, 581.1, 762

See application file for complete search history.

(56) References Cited

U.S. PATENT DOCUMENTS 1,447,725 A * 3/1923 Kelley .................. 403/292
2,746,109 A    5/1956 Budai (Continued)

FOREIGN PATENT DOCUMENTS

CH    27 82 12    4/1952

(Continued)

OTHER PUBLICATIONS

Siemens catalog DA 65.11—2001 titled "Simovert Masterdrives Motion Control", chapter 6, in particular p. 6/47.

(Continued)

*Primary Examiner*—Daniel P. Stodola
*Assistant Examiner*—Ernesto Garcia
(74) *Attorney, Agent, or Firm*—Henry M. Feiereisen; Ursula B. Day

(57) ABSTRACT

A device for plane-parallel attachment of a first module to a sidewall of a second module includes at least one coupling element with clamping projections having beveled end sections. The coupling element includes a guide element with two opposing guide tabs, a locking element, and a stop element, wherein the guide tabs, the locking element, and the stop element abut sidewalls of the connecting element so that the two guide tabs extend from a first opposing pair of the sidewalls, and the locking element and the stop element extend from another opposing pair of the sidewalls perpendicular to the first pair. The first module includes an interlock for captivating the coupling element or elements in the sidewall of the first module, whereas the second module has a receiving part capable of receiving the coupling element or elements captivated in the sidewall of the first module.

18 Claims, 4 Drawing Sheets

U.S. PATENT DOCUMENTS

| | | | | |
|---|---|---|---|---|
| 3,715,136 | A | * | 2/1973 | Yoshida ................... 403/294 |
| 3,990,131 | A | * | 11/1976 | Okamura ................ 403/408.1 |
| 4,159,592 | A | * | 7/1979 | Gabriel |
| 4,367,871 | A | * | 1/1983 | Schiefer ................... 403/294 |
| 4,408,812 | A | * | 10/1983 | Krautwurst ................ 312/111 |
| 4,591,228 | A | * | 5/1986 | Vasseur .................... 439/715 |
| 4,733,771 | A | * | 3/1988 | Grundken et al. |
| 4,893,777 | A | * | 1/1990 | Gassaway ................. 403/315 |
| 5,143,467 | A | * | 9/1992 | Gardner ................. 403/408.1 |
| 5,145,132 | A | * | 9/1992 | Kirschner ................ 403/381 |
| 5,207,601 | A | * | 5/1993 | Vasseur et al. |
| 5,433,416 | A | * | 7/1995 | Johnson ................... 403/381 |
| 5,539,599 | A | * | 7/1996 | Wilder .................... 403/381 |
| 5,860,758 | A | * | 1/1999 | Kozyrski et al. ........... 403/292 |
| 5,953,963 | A | * | 9/1999 | Wirsing et al. ............ 403/106 |
| 5,993,100 | A | * | 11/1999 | Gastmann ................. 403/292 |
| 6,142,435 | A | * | 11/2000 | Lodi ....................... 403/316 |
| 6,615,561 | B2 | * | 9/2003 | MacDonald et al. ........ 52/606 |
| 6,622,447 | B1 | * | 9/2003 | Kessler .................... 403/381 |
| 6,668,940 | B1 | * | 12/2003 | Ryan ........................ 403/24 |
| 6,821,058 | B1 | * | 11/2004 | Dawson .................... 405/284 |

FOREIGN PATENT DOCUMENTS

| | | | |
|---|---|---|---|
| DE | 467002 | * | 10/1928 |
| DE | 1 654 587 | B | 2/1971 |
| DE | 16 90 085 | B | 4/1971 |
| DE | 295 10 176 | U1 | 10/1995 |
| DE | 296 09 198 | U1 | 10/1996 |
| DE | 29703565 | U1 * | 4/1997 |
| EP | 0 148 765 | A | 7/1985 |
| EP | 0 626 712 | A | 11/1994 |
| FR | 2 590 104 | A | 5/1987 |
| WO | WO 200022243 | A1 * | 4/2000 |

OTHER PUBLICATIONS

Siemens catalog DA 65.4—2001 titled "Simodrive 611 universal und Posmo", chapter 6, in particular p. 6/26.

* cited by examiner

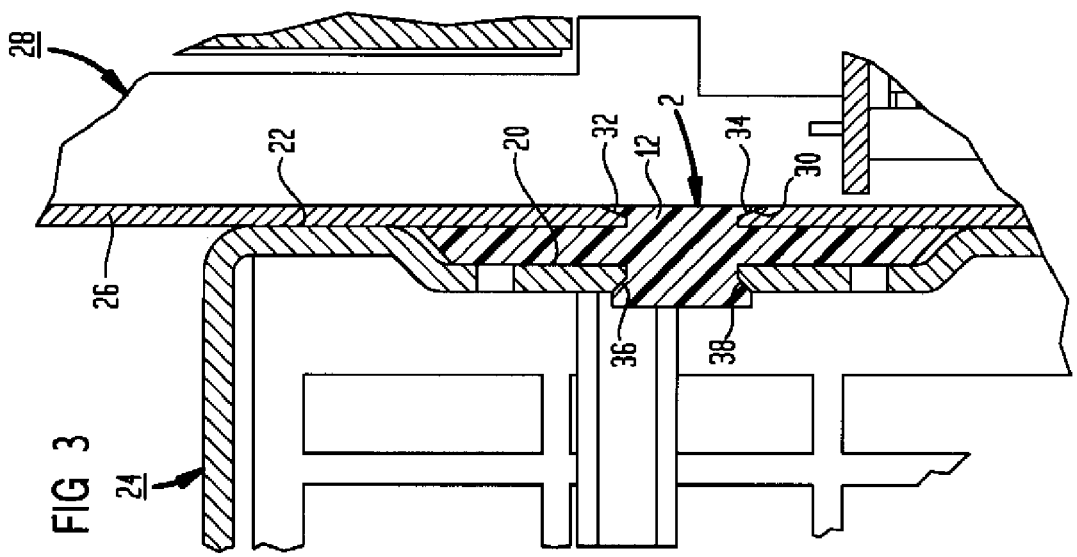
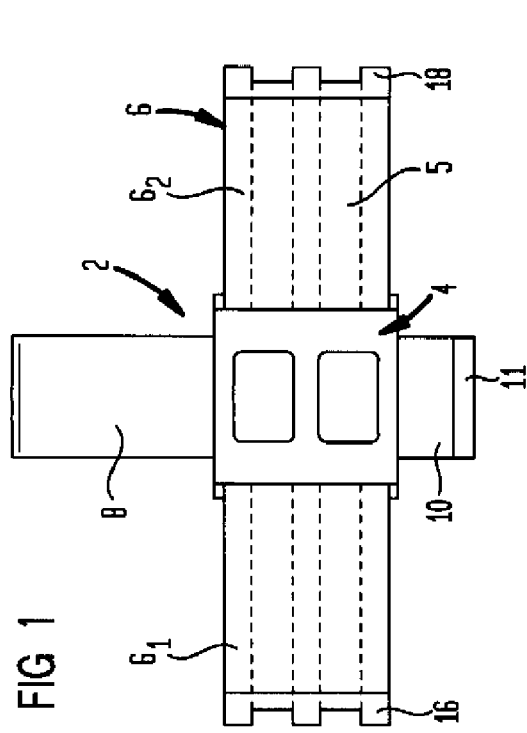
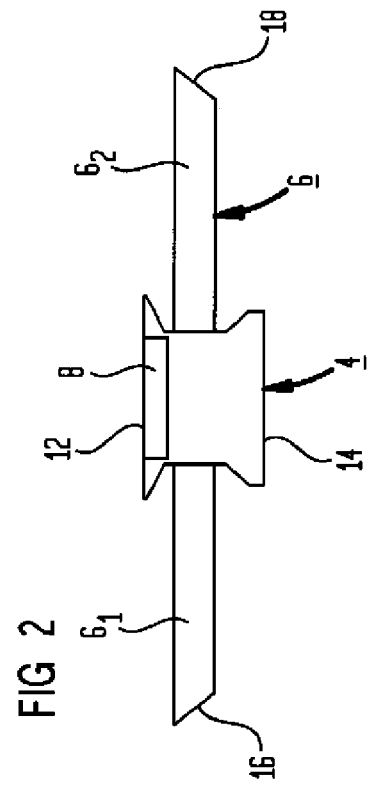

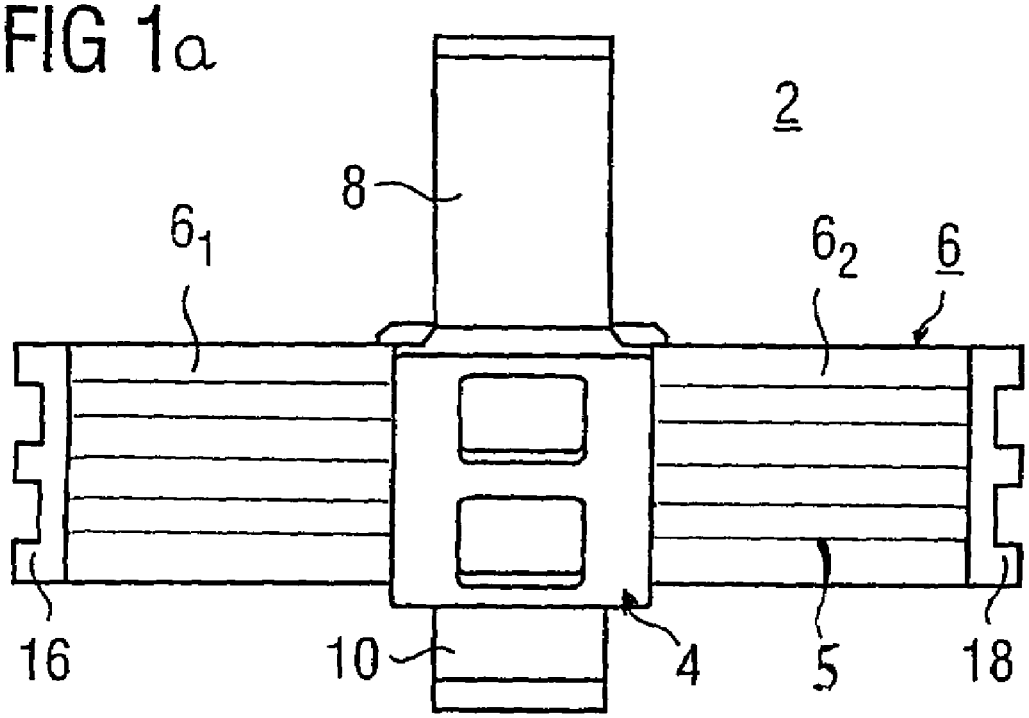

DEVICE FOR PLANE-PARALLEL ATTACHMENT OF TWO MODULES

CROSS-REFERENCES TO RELATED APPLICATIONS

This application is a continuation of prior filed copending PCT International application no. PCT/DE 2003/002428, filed Jul. 18, 2003, which designated the United States and on which priority is claimed under 35 U.S.C. §120 and which claims the priority of German Patent Application, Serial No. 102 34 788.3, filed Jul. 30, 2002, pursuant to 35 U.S.C. 119(a)-(d).

BACKGROUND OF THE INVENTION

The present invention relates to a device for attaching a module to a sidewall of another module without the use of tools, and more particularly to a coupling element for the device.

Nothing in the following discussion of the state of the art is to be construed as an admission of prior art.

An exemplary modular drive system is described, for example, in the Siemens catalog DA 65.11-2001 titled "SIMOVERT MASTERDRIVES Motion Control", chapter 6, in particular page 6/47. The modular drive system depicted in FIG. 6/42 of the catalog includes a capacitive module, a power supply module with a control section, and seven inverter modules, all of which are arranged side-by-side and electrically connected with each other by a DC link bus rail. Because these modules are all releasably attached to a mounting wall, in particular the rear wall of a service cabinet, with the front sides of the modules forming a continuous front side of the modular drive system, all modules must have the same depth. The modules of the drive system should also have the same height, so that the modular drive system has the configuration of a rectangular prism. The only difference between the modules of the modular drive system is their respective width.

The width of each module is determined by the electric circuit housed in the module. For example, the width of inverter modules depends largely on the rated power of the inverter. However, even an inverter module with a very small rated power, for example, an inverter driving only a single axle, must be housed in a module of a predefined height and length in order to maintain the rectangular arrangement of the modular drive system, when the module is releasably attached to the mounting wall, such as a real wall of a service cabinet.

The Siemens catalog DA 65.4-2001 titled "SIMODRIVE 611 universal und POSMO", chapter 6, in particular page 6/26, discloses another embodiment of a modular drive system, which has a different module design and a different electrical interconnect design. The modules of this modular drive system are also arranged side-by-side and releasably attached to a mounting wall, in particular a rear wall of a service cabinet. Likewise, the front sides of the individual modules also form the front face of the modular drive system. The individual modules again differ mechanically only in their width, thereby retaining the homogeneous rectangular configuration of the modular drive system.

Each module of the afore-described modular drive systems requires an upper and lower attachment bracket for releasable attachment on a mounting wall, which requires corresponding openings in the mounting wall and a tool for attaching the modules.

It would therefore be desirable and advantageous to provide a device for plane-parallel attachment of a module on a sidewall of another module, which obviates prior art shortcomings and enables attachment of modules having different heights and/or depths without requiring a tool for their installation.

SUMMARY OF THE INVENTION

According to one aspect of the present invention, a coupling element for connecting two modules in a plane-parallel fashion includes a connecting element having two flat surfaces and sidewalls, with each of the flat surfaces having clamping projections with beveled end sections, wherein the beveled end sections of different flat surfaces face each other. The coupling element further includes a guide element having two opposing guide tabs, a locking element, and a stop element, with the guide tabs, the locking element, and the stop element abutting the sidewalls of the connecting element. The two guide tabs extend from a first opposing pair of the sidewalls, whereas the locking element and the stop element extend from another pair of the sidewalls perpendicular to the first pair.

According to another aspect of the invention, a device for plane-parallel attachment of a first module to a sidewall of a second module includes at least one coupling element having two flat surfaces and sidewalls, with each of the flat surfaces having clamping projections with beveled end sections, and with the beveled end sections of different flat surfaces facing each other. The coupling element includes a guide element having two opposing guide tabs, a locking element, and a stop element, wherein the guide tabs, the locking element, and the stop element abut the sidewalls of the connecting element so that the two guide tabs extend from a first opposing pair of the sidewalls, and the locking element and the stop element extend from another pair of the sidewalls perpendicular to the first pair. The first module includes an interlock for securing the coupling element or elements in the sidewall of the first module, whereas the second module has a receiving part capable of receiving the coupling element or elements secured in the sidewall of the first module.

Advantageously, at least two coupling elements are provided, wherein a sidewall of a second module being attached to a first module has for each of the coupling elements a corresponding receiving part, and a sidewall of the additional module has for each coupling element a corresponding interlock, so that the second module can be readily secured to the sidewall of the first model by insertion, thus obviating the need for a tool. Before a second module can be inserted into sidewall of the first module, the coupling elements must first be inserted into the receiving parts on the sidewall of the second device. Advantageously, the corresponding receiving parts are configured to captivate the coupling elements.

Each locking element in the sidewall of the second module may be formed as a recess with a centrally located slot, with the depth of the recess selected to be sufficient to enable the two opposing sidewalls of the attached modules to be plane-parallel to each other and to make contact over a large area in spite of the intervening coupling elements. The recesses for the coupling elements also firmly grip the respective coupling elements. Advantageously, the guide tabs can be implemented in the form of grooves, ribs or a corrugated structure.

The slots disposed in the sidewalls of the first and second module each include opposing projections that grip an inserted coupling element. The opposing projections of the slots disposed in the sidewall of the second module are arranged in the lower region of these slots, whereas the opposing projections of the slots disposed in the sidewall of the first module are located in the upper region of these slots.

Even after a module of a modular drive system has already been releasably attached to another module, an additional module can be attached plane-parallel to a sidewall of that module, without requiring a tool for installation, by using at least two coupling elements. The number of the required coupling elements depends on the size and weight of the module to be attached.

Advantageously, the connecting element, guide element, locking element and stop element can be made of separate parts and joined to form an assembly. In an advantageous embodiment, the guide element, the locking element and the stop element can be integrally formed with the connecting element, for example, by casting or molding. Advantageously, the coupling element according to the invention can be a plastic part fabricated, for example, by injection molding.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 1 is a plan view of a coupling element according to the invention;

FIG. 1a is a top view of a modified coupling element according to the invention;

FIG. 2 is a top view of the coupling element of FIG. 1;

FIG. 3 is a cross-sectional view of two attached modules and the coupling element of FIG. 1 according to the invention at an attachment point;

DETAILED DESCRIPTION OF PREFERRED EMBODIMENTS

Figure 4:
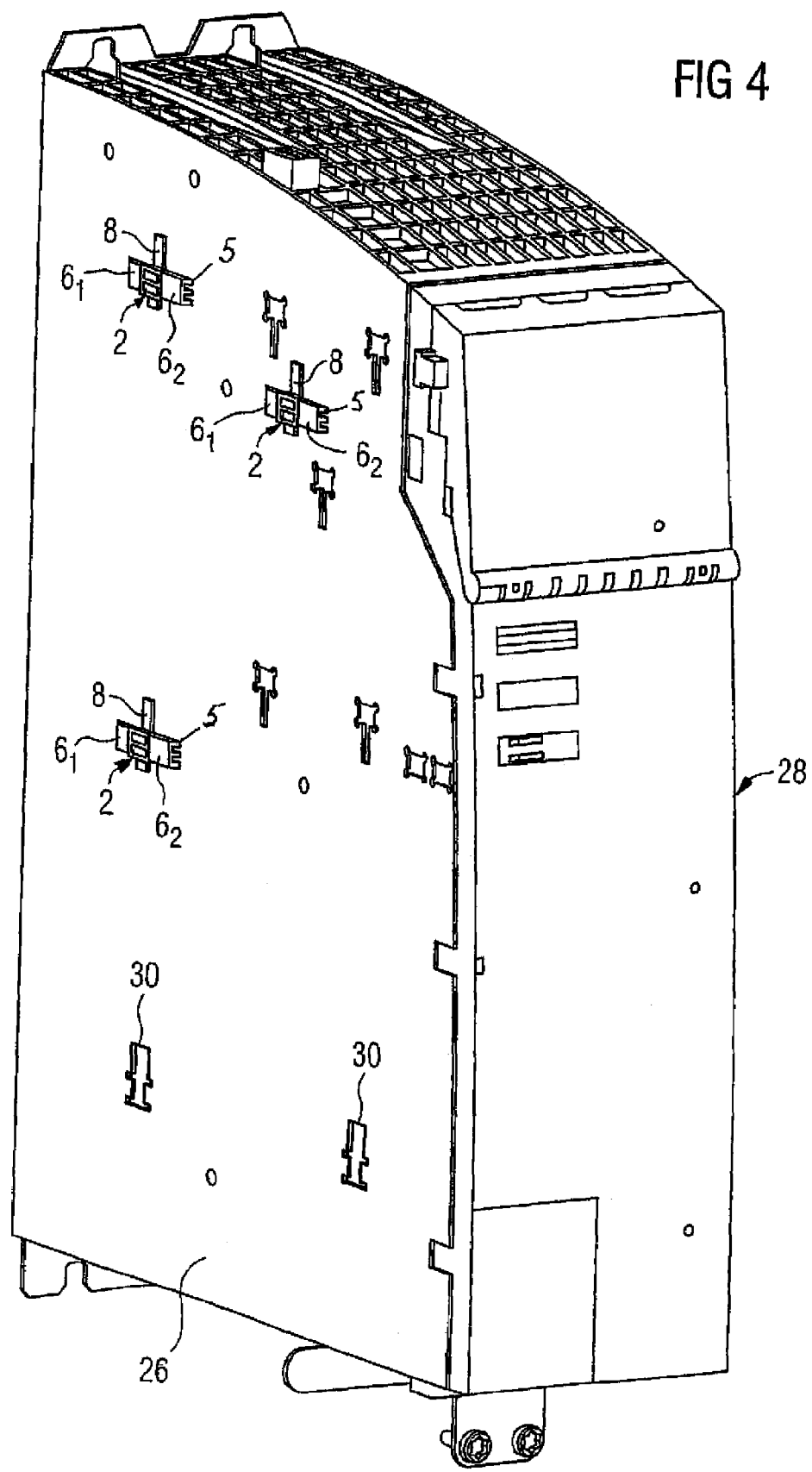
FIG. 4 is a perspective view of a module with inserted coupling elements of FIG. 1.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown in a plan view a coupling element 2 according to the invention for plane-parallel attachment of two modules along their respective opposing sidewalls. As shown in FIG. 1, the coupling element 2 includes a connecting element 4, a guide element 6, a locking element 8, and a stop element 10. The locking element 8 is implemented as a locking tab that is attached to or formed on one side on the connecting element 4. The guide element 6 is configured to include two opposing guide tabs $6_1$ and $6_2$, with the guide tabs $6_1$, $6_2$ being attached to or formed on corresponding sides of the connecting element 4. The stop element 10 terminates in a beveled end face 11 and is also attached to or formed on a side of the connecting element 4 that is opposite to the locking element 8. The stop element 10 extends hereby in offset relationship to the locking element 8, as indicated in FIG. 4. The coupling element 2 can be made by using separate components 4, 6, 8, 10 that can be joined together by soldering, welding, riveting, and other joining techniques known in the art. Currently preferred however is the manufacture of a single-piece construction of the coupling element 2 of plastic, for example in form of an injection-molded plastic part.

As shown in FIG. 2 the connecting element 4 of the coupling element 2 has opposite dovetailed end sections to form two clamping elements 12 and 14. The sidewalls of each clamping element 12 and 14 facing the guide tabs $6_1$ and $6_2$ are beveled on the side facing the guide tabs $6_1$, $6_2$. The front faces 16 and 18 of the guide tabs $6_1$ and $6_2$ are also beveled. The bevel angle of the front faces 16 and 18 depends on the bevel angle of the sidewalls of a recess 20 formed in the sidewall 22 of a module 24 that is to be attached (see FIG. 3). The guide tabs $6_1$ and/or $6_2$ can include ribs 5, such as grooves and/or corrugations, so as to achieve a high rigidity with the least amount of material, as shown by way of example in FIG. 1a.

FIG. 3 is a cross-sectional view through an attachment point of a sidewall 22 of module 24 attached in plane-parallel disposition to a sidewall 26 module 28 with the coupling element 2 of the invention. At the attachment point, the sidewall 26 of module 28 includes a slot 30 with opposing projections 32 and 34 that hold the coupling element 2 by engaging behind the inwardly beveled sidewalls of the clamping element 12. The sidewall 22 of module 24 has a recess 20 with a slot located approximately at the center of the recess 20. This slot includes opposing projections 36 and 38 that engage behind the beveled sidewall of the clamping element 14. The beveled front faces 16 and 18 of the two opposing guide tabs $6_1$ and $6_2$ of coupling element 2 contact the recess 20 along the sidewall 22, thereby ensuring that the coupling element 2 is clamped with the proper orientation in the recess 20 for precise alignment of module 24 relative to module 28. The stop element 10 provided on the coupling element 2 can also has a beveled front face to prevent the module 24 from accidentally being pulled out of the sidewall 26 of module 28 without a sufficiently large applied force. The bevel angle of the front face of stop element 10 corresponds approximately to the bevel angle of the recess 20. The coupling element is then gripped in recess 20 of sidewall 22 of module 24 from three sides, namely at the two opposing guide tabs 61 and 62 and the stop element 10. The force required to release the modules 24 and 28 from each other is determined, among others, by the afore-described bevel angles, which can be suitably selected so as not to unnecessarily increase the required force.

FIG. 4 shows in a perspective view another embodiment of a module 28. Several coupling elements 2 are inserted in sidewall 26 of module 28. The coupling elements 2 are disposed in slots 30 and held captive by the locking element 8 in the sidewall 26 of module 28. The opposing guide tabs $6_1$ and $6_2$ of each coupling element 2 rest on the sidewall 26 of module 28 which represents a compact industrial electronic device in book-size format. This industrial electronic device can be a module of a modular drive system, for example, a power supply module or an inverter module.

Figure 5:
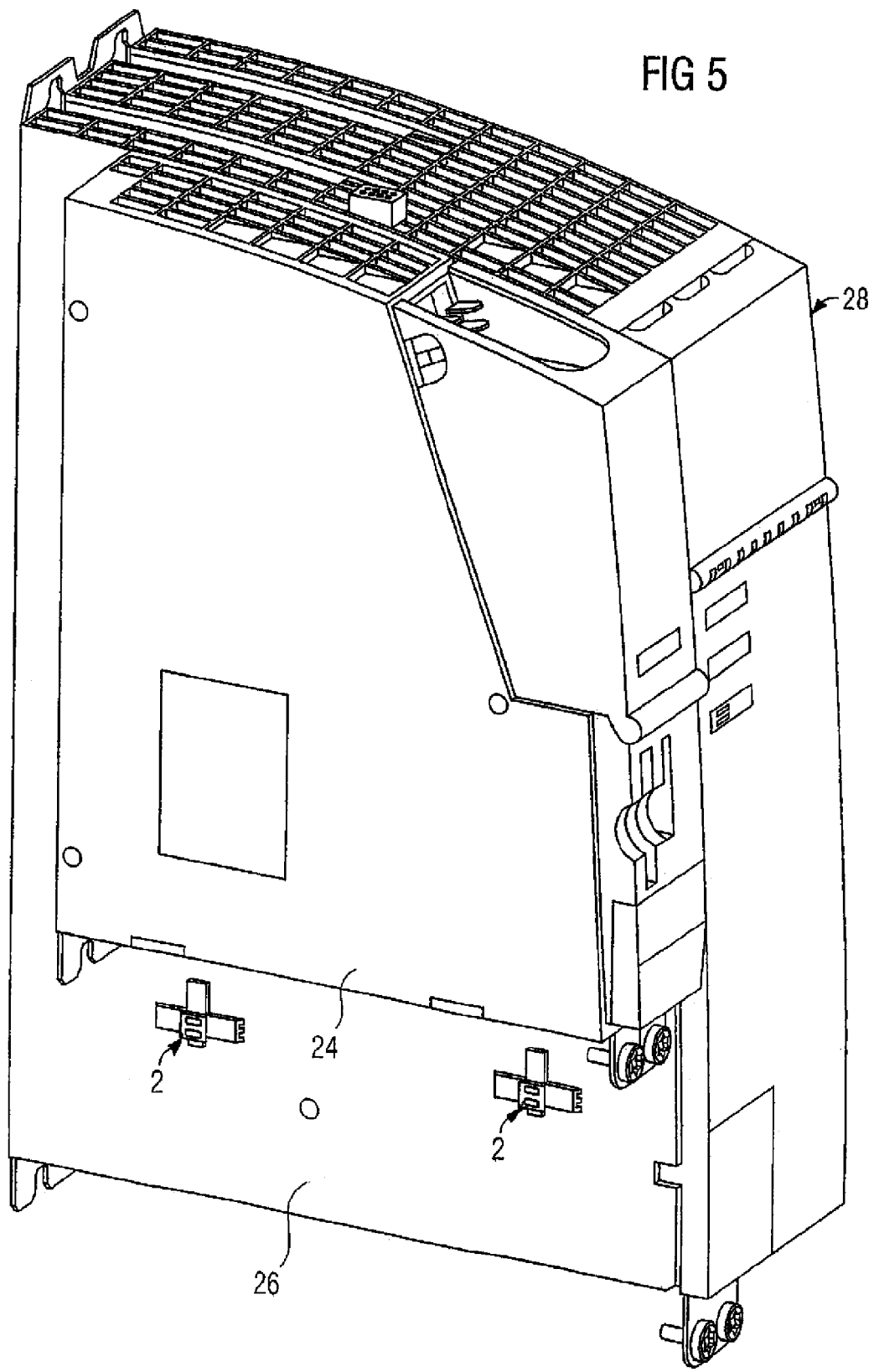
FIG. 5 is a perspective view of two attached modules having different height and depth.

FIG. 5 shows in a perspective view the module 28 of FIG. 4, with another module 24 attached to the sidewall 26 of module 28. The front side of the module 24 forms the front face of a modular drive system regardless of the size of the attached module 24. To attach the module 24 to module 28, the (obscured) sidewall 22 of module 24 is first placed against the sidewall 26 of module 28, with the module 24 protruding from module 28. The module 24 is then pushed downward until the coupling elements 2 interlock with the corresponding slots of the recess 20 disposed in the sidewall 22 of module 24. The two modules 24 and 28 are then at the same height. The module 24 can be detached from module 28 by performing the above steps in reverse, while applying a sufficiently large force to overcome the interlocking force, as described above. The modules 24 and 28 can have the same or different dimensions.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A coupling element for connecting a sidewall of one module to an opposite sidewall of another module, comprising:
    a connecting element constructed with opposite dovetailed end sections for respective insertion and clamping in an opening in the sidewall of one module and an opening in the sidewall of the other module, said connecting element having four sidewalls extending between the dovetailed end sections, two of the sidewalls being perpendicular to the other two sidewalls;
    a first guide tab extending from a first one of the sidewalls of the connecting element;
    a second guide tab extending from a second one of the sidewalls of the connecting element in opposition to the first sidewalls;
    a locking element extending from a third one of the sidewalls of the connecting element; and
    a stop element extending from a fourth one of the sidewalls of the connecting element in opposition to the third sidewall,
    wherein the guide tabs have an end face that is beveled.

2. The coupling element of claim 1, wherein the locking element, the stop element, the guide tabs and the connecting element are constructed as a single-piece.

3. The coupling element of claim 1, wherein the coupling element is made of plastic.

4. The coupling element of claim 1, wherein the coupling element is an injection molded plastic part.

5. The coupling element of claim 1, wherein the stop element has a beveled end face.

6. A coupling element for connecting a sidewall of one module to an opposite sidewall of another module, comprising:
    a connecting element constructed with opposite dovetailed end sections for respective insertion and clamping in an opening in the sidewall of one module and an opening in the sidewall of the other module, said connecting element having four sidewalls extending between the dovetailed end section, two of the sidewalls being perpendicular to the other two sidewalls;
    a first guide tab extending from a first one of the sidewalls of the connecting element;
    a second guide tab extending from a second one of the sidewalls of the connecting element in opposition to the first sidewall;
    a locking element extending from a third one of the sidewalls of the connecting element; and
    a stop element extending from a fourth one of the sidewalls of the connecting element in opposition to the third sidewall,
    wherein the guide tabs are one of grooved, ribbed and corrugated.

7. The coupling element of claim 6, wherein the locking element, the stop element, the guide tabs and the connecting element are constructed as a single-piece.

8. The coupling element of claim 6, wherein the coupling element is made of plastic.

9. The coupling element of claim 6, wherein the coupling element is an injection molded plastic part.

10. The coupling element of claim 6, wherein the stop element has a beveled end face.

11. A coupling element for connecting a sidewall of one module to an opposite sidewall of another module, comprising:
    a connecting element constructed with opposite dovetailed end sections for respective insertion and clamping in an opening in the sidewall of one module and an opening in the sidewall of the other module, said connecting element having four sidewalls extending between the dovetailed end sections two of the sidewalls being perpendicular to the other two sidewalls;
    a first guide tab extending from a first one of the sidewalls of the connecting element;
    a second guide tab extending from a second one of the sidewalls of the connecting element in opposition to the first sidewall;
    a locking element extending from a third one of the sidewalls of the connecting element; and
    a stop element extending from a fourth one of the sidewalls of the connecting element in opposition to the third sidewall,
    wherein the locking element and the stop element extend in offset relationship.

12. The coupling element of claim 11, wherein the locking element, the stop element, the guide tabs and the connecting element are constructed as a single-piece.

13. The coupling element of claim 11, wherein the coupling element is made of plastic.

14. The coupling element of claim 11, wherein the coupling element is an injection molded plastic part.

15. The coupling element of claim 11, wherein the stop element has a beveled end face.

16. An assembly comprising:
    a first module having a sidewall;
    a second module having a sidewall; and
    a coupling element for connecting the sidewall of the first module to the sidewall of the second module, said coupling element including a connecting element which is constructed with opposite dovetailed end sections being respectively inserted and clamped in an opening in the sidewall of the first module, and an opening in the sidewall of the second module, and which has four sidewalls extending between the dovetailed end sections, two of the sidewalls being perpendicular to the other two sidewalls, a first guide tab extending from a first one of the sidewalls of the connecting element for placement between the sidewalls of the modules, a second guide tab extending from a second one of the sidewalls of the connecting element in opposition to the first sidewall for placement between the sidewalls of the modules; a locking element extending from a third one of the sidewalls of the connecting element for placement in the opening in the sidewall of the second module, and a stop element extending from a fourth one of the sidewalls of the connecting element in opposition to the third sidewall for placement against an inside of the sidewall of the first module.

17. The assembly of claim 16, wherein the opening in the sidewall of the second module is a slot having opposing projections disposed in a lower region of the slot.

18. The assembly of claim 16, wherein the sidewall of the first module comprises a recess with a slot located centrally in the recess and having opposing projections in an upper region of the slot.

* * * * *